(12) United States Patent
Lin et al.

(10) Patent No.: US 10,317,949 B1
(45) Date of Patent: Jun. 11, 2019

(54) SERVER HAVING REMOVABLE STORAGE STRUCTURE

(71) Applicant: Super Micro Computer Inc., San Jose, CA (US)

(72) Inventors: Te-Chang Lin, San Jose, CA (US); William Shen, San Jose, CA (US); Pan-pan Liang, San Jose, CA (US)

(73) Assignee: SUPER MICRO COMPUTER INC., San Jose, CA (US)

( * ) Notice: Subject to any disclaimer, the term of this patent is extended or adjusted under 35 U.S.C. 154(b) by 0 days.

(21) Appl. No.: 15/955,514

(22) Filed: Apr. 17, 2018

(51) Int. Cl.
| | |
|---|---|
| *G06F 1/16* | (2006.01) |
| *H05K 7/14* | (2006.01) |
| *H05K 5/02* | (2006.01) |
| *G06F 1/18* | (2006.01) |

(52) U.S. Cl.
CPC .............. *G06F 1/166* (2013.01); *G06F 1/187* (2013.01); *H05K 5/023* (2013.01); *H05K 7/1411* (2013.01); *H05K 7/1487* (2013.01)

(58) Field of Classification Search
CPC .... H05K 7/1411; H05K 5/023; H05K 7/1487; G06F 1/166; G06F 1/187; Y10T 16/44
See application file for complete search history.

(56) References Cited

U.S. PATENT DOCUMENTS

| | | | | |
|---|---|---|---|---|
| 5,020,151 | A  * | 5/1991 | Sampei | B60R 11/0205 312/7.1 |
| 5,385,870 | A  * | 1/1995 | Maue | H01R 13/62933 439/157 |
| 5,791,753 | A  * | 8/1998 | Paquin | H05K 7/1411 312/223.1 |
| 6,193,532 | B1 * | 2/2001 | Smithson | H05K 7/1411 439/157 |
| 6,222,736 | B1 * | 4/2001 | Sim | G06F 1/184 361/727 |
| 9,122,458 | B2 * | 9/2015 | Yu | G06F 1/185 |
| 9,911,464 | B2 * | 3/2018 | Jau | G06F 1/187 |
| 2003/0155471 | A1 * | 8/2003 | Dean | G06F 1/184 248/27.1 |
| 2009/0080165 | A1 * | 3/2009 | Barina | H05K 7/1411 361/747 |

* cited by examiner

*Primary Examiner* — James Wu
(74) *Attorney, Agent, or Firm* — Chun-Ming Shih; HDLS IPR Services

(57) ABSTRACT

A server having a removable storage structure is provided. The server includes a housing, a storage case and a handle structure. The housing includes a bottom plate, a first plate and a second plate. The first plate includes a guiding slot. The storage case is arranged between the first plate and the second plate. The storage case includes a support plate, a partition plate and a heat dissipating plate. The partition plate is in contact with the first plate and includes a sliding slot. The handle structure includes a first arm, a second arm, a handle, and a slide pin. The first arm is pivotally connected to the partition plate and includes a through hole. The second arm is pivotally connected to the second plate. The slide pin is inserted in the sliding slot and the guiding slot via the through hole.

10 Claims, 9 Drawing Sheets

SERVER HAVING REMOVABLE STORAGE STRUCTURE

TECHNICAL FIELD

The present invention relates to a server and, in particular, to a server having a removable storage structure.

BACKGROUND

A server typically receives, inside its housing, electronic devices such as a motherboard, a storage device and a power supply. The space inside the housing is divided into multiple spaces for receiving arrays of storage devices.

In addition to the storage capacity (i.e. the number of the hard disks installed), designing a server should also consider the depth of a rack, an opening direction, configuration of the power supply, convenient replacement of the hard disks, and etc. Arrays of storage devices are usually replaced from the front side of the rack. However, it would be more convenient for a user to replace the arrays of storage devices from the back side of the rack when the length (the depth) of the rack is long.

In view of this, the inventor studied various technologies and created an effective solution in the present disclosure.

SUMMARY

It is an objective of the present invention to provide a server having a removable storage structure, whereby a storage case is removed by means of a handle structure.

Accordingly, the present invention provides a server having a removable storage structure.

The server includes a housing, a storage case and a handle structure. The housing includes a bottom plate and includes a first plate and a second plate spaced apart from each other on the bottom plate. The first plate includes a guiding slot. The storage case is disposed on the bottom plate and is arranged between the first plate and the second plate. The storage case includes a support plate on which a motherboard is disposed and includes a partition plate and a heat dissipating plate disposed around the support plate. The partition plate is in contact with the first plate. The partition plate includes a sliding slot disposed corresponding to the guiding slot. The heat dissipating plate is disposed between the second plate and the partition plate. The handle structure includes a first arm, a second arm, a handle connected to the first arm and the second arm, and a slide pin. The first arm is pivotally connected to the partition plate and includes a through hole. The second arm is pivotally connected to the second plate. The slide pin is inserted in the sliding slot and the guiding slot via the through hole. When the handle is rotated with respect to the heat dissipating plate by means of the first arm and the second arm, the slide pin is moved in the sliding slot and guided by the guiding slot, thereby driving the partition plate to move in a direction away from the bottom plate.

Compared to conventional techniques, when the handle structure is rotated downwards, the slide pin is moved in the sliding slot and guided by the guiding slot, thereby driving the partition plate to move out of the bottom plate. Moreover, when the handle structure is rotated to a particular angle, a user can hold the handle and exert a force unto it to remove the storage case from the housing. Therefore, the present invention can be used conveniently with good practicability.

BRIEF DESCRIPTION OF THE DRAWINGS

The disclosure will become more fully understood from the detailed description and the drawings given herein below for illustration only, and thus does not limit the disclosure, wherein.

DETAILED DESCRIPTION

Detailed descriptions and technical contents of the present disclosure are illustrated below in conjunction with the accompanying drawings. However, it is to be understood that the descriptions and the accompanying drawings disclosed herein are merely illustrative and exemplary and not intended to limit the scope of the present disclosure.

Figure 1:
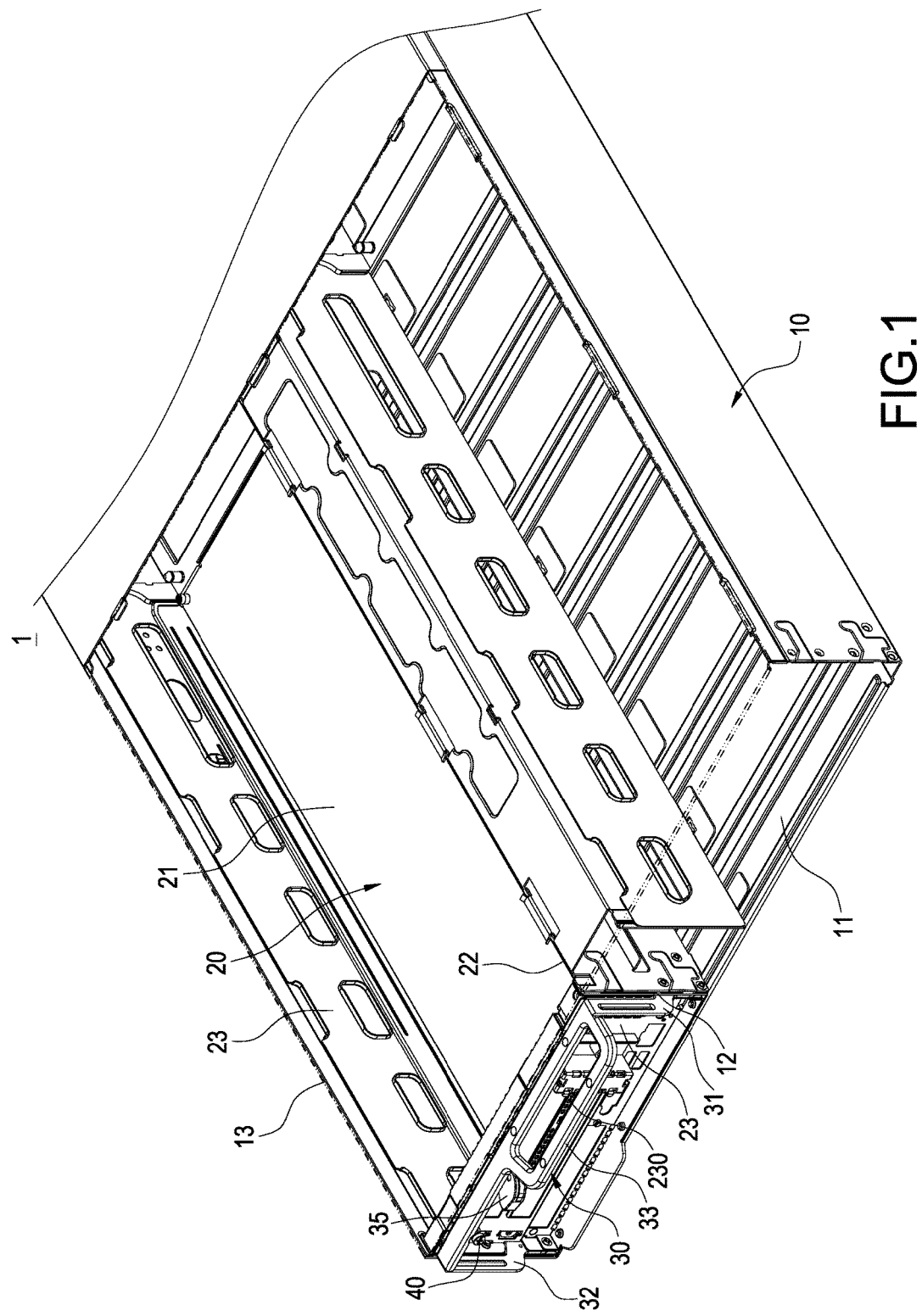
FIG. 1 is a perspective view illustrating a server having a removable storage structure according to the present invention.
Figure 2:
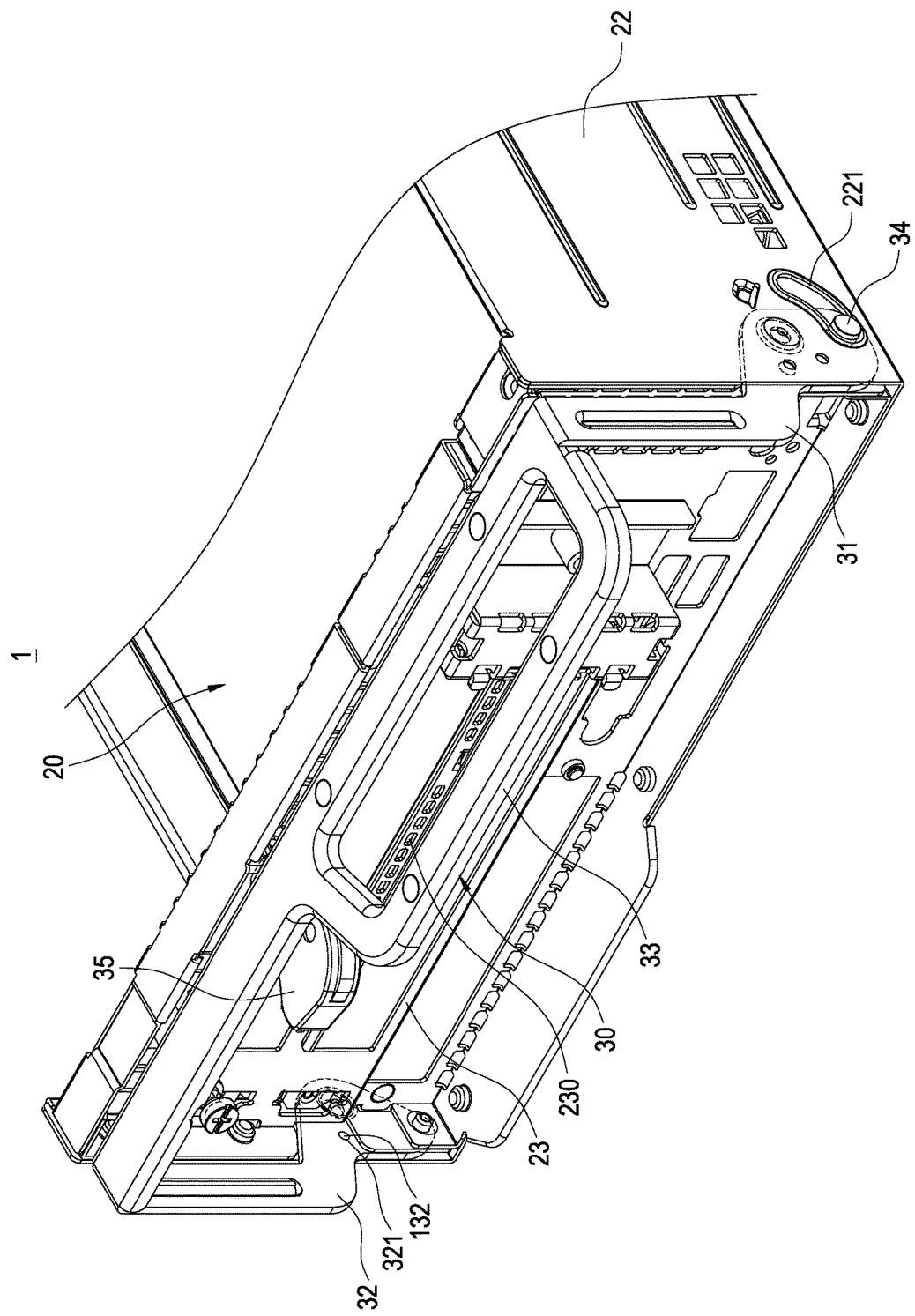
FIG. 2 is a perspective partial view illustrating a storage case.
Figure 3:
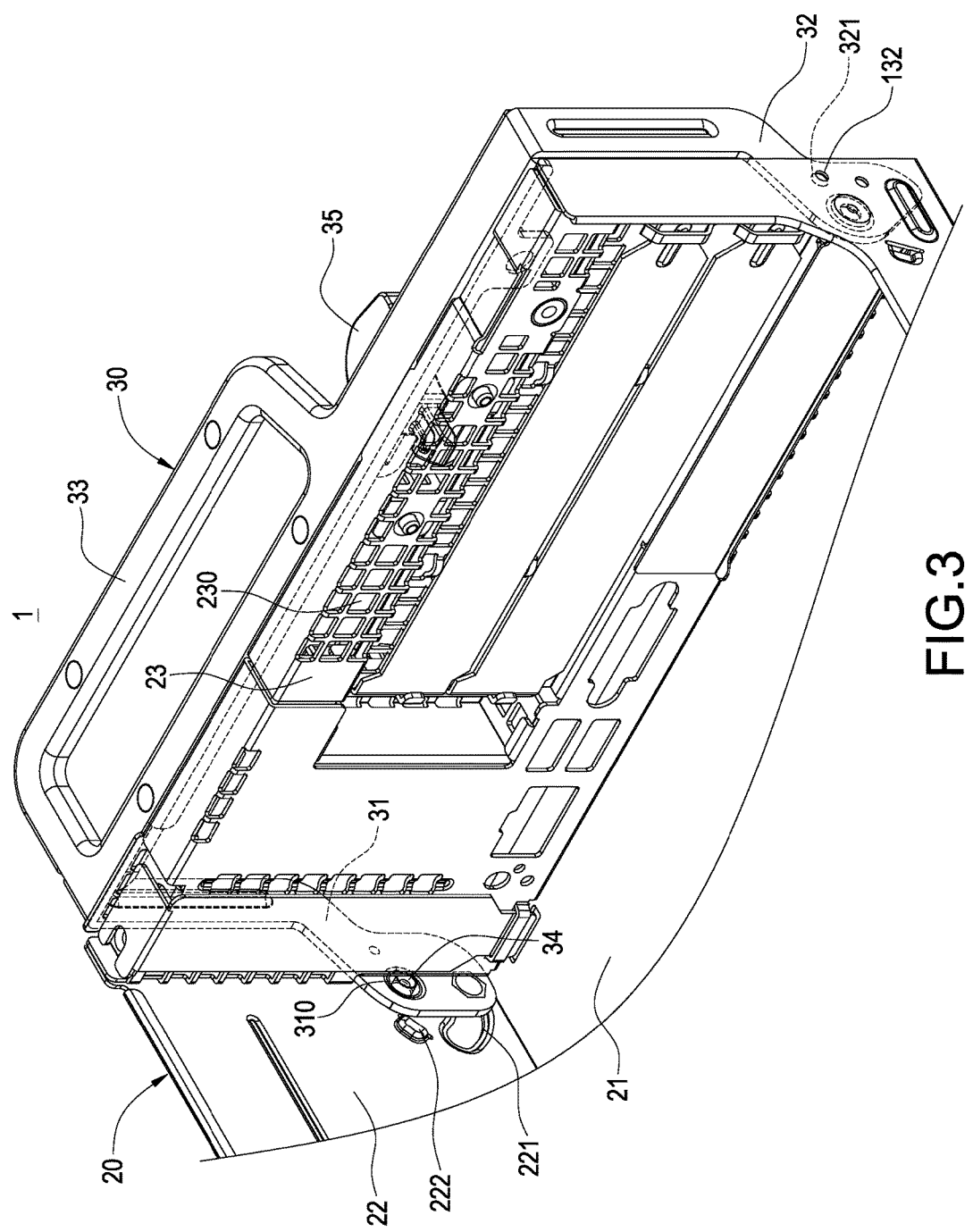
FIG. 3 is a perspective partial view taken from a different angle, illustrating the storage case.

Please refer to FIGS. 1 to 3 for a perspective view illustrating a server having a removable storage structure and for two perspective partial views of a storage case, taken from different angles. The present invention provides a server 1 having a removable storage structure. The server 1 includes a housing 10, a storage case 20 and a handle structure 30. The storage case 20 is for receiving a motherboard and a plurality of hard disks (not illustrated). The handle structure 30 is coupled to the storage case 20. The storage case 20 can be removed from the housing 10 by exerting a force to the handle structure 30. The server 1 having the removable storage structure is further detailed as below.

Referring to FIGS. 1 and 2, the housing 10 includes a bottom plate 11 and also includes a first plate 12 and a second plate 13 spaced apart from each other on the bottom plate 11. The first plate 12 includes a guiding slot 121.

The storage case 20 is disposed on the bottom plate 11 and is arranged between the first plate 12 and the second plate 13. The storage case 20 includes a support plate 21 on which a motherboard (not illustrated) is disposed and includes a partition plate 22 and a heat dissipating plate 23 disposed around the support plate 21. The partition plate 22 is in contact with the first plate 12. The partition plate 22 includes a sliding slot 221 disposed corresponding to the guiding slot 121. The heat dissipating plate 23 is disposed between the second plate 13 and the partition plate 22 and includes a plurality of heat dissipating holes 230.

The handle structure 30 includes a first arm 31, a second arm 32, a handle 33 connected to the first arm 31 and the second arm 32, and a slide pin 34. The first arm 31 is pivotally connected to the partition plate 22 and includes a through hole 310 (see FIG. 3). The second arm 32 is pivotally connected to the second plate 13. The slide pin 34 is inserted in the sliding slot 221 and the guiding slot 121 via the through hole 310. It is preferable that the first arm 31, the second arm 32 and the handle 33 are integrally formed of one meal plate by pressing and bending processes; however, the present invention is not limited in this regard.

In one embodiment of the present invention, the server 1 further includes a fastening element 40. The handle structure 30 is screw connected to the heat dissipating plate 23 by means of the fastening element 40. Accordingly, when it is intended to leave the handle structure 30 unused for a long time, a user may secure the handle structure 30 by using the fastening element 40 to thereby prevent the handle structure 30 from being rotated.

In the embodiment shown in FIG. 3, a first blocker 222 is disposed on the partition plate 22 and is arranged adjacent to the sliding slot 221. When the first arm 31 is rotated to a predetermined angle with respect to the partition plate 22, the first arm 31 is blocked by the first blocker 222 and stops rotating. In this way, the rotation angle of the handle structure 30 is limited. Furthermore, the second blocker 131 is disposed on the second plate 13. When the second arm 32 is rotated to a predetermined angle with respect to the second plate 13, the second arm 32 is blocked by the second blocker 131 and stops rotating.

Figure 4:
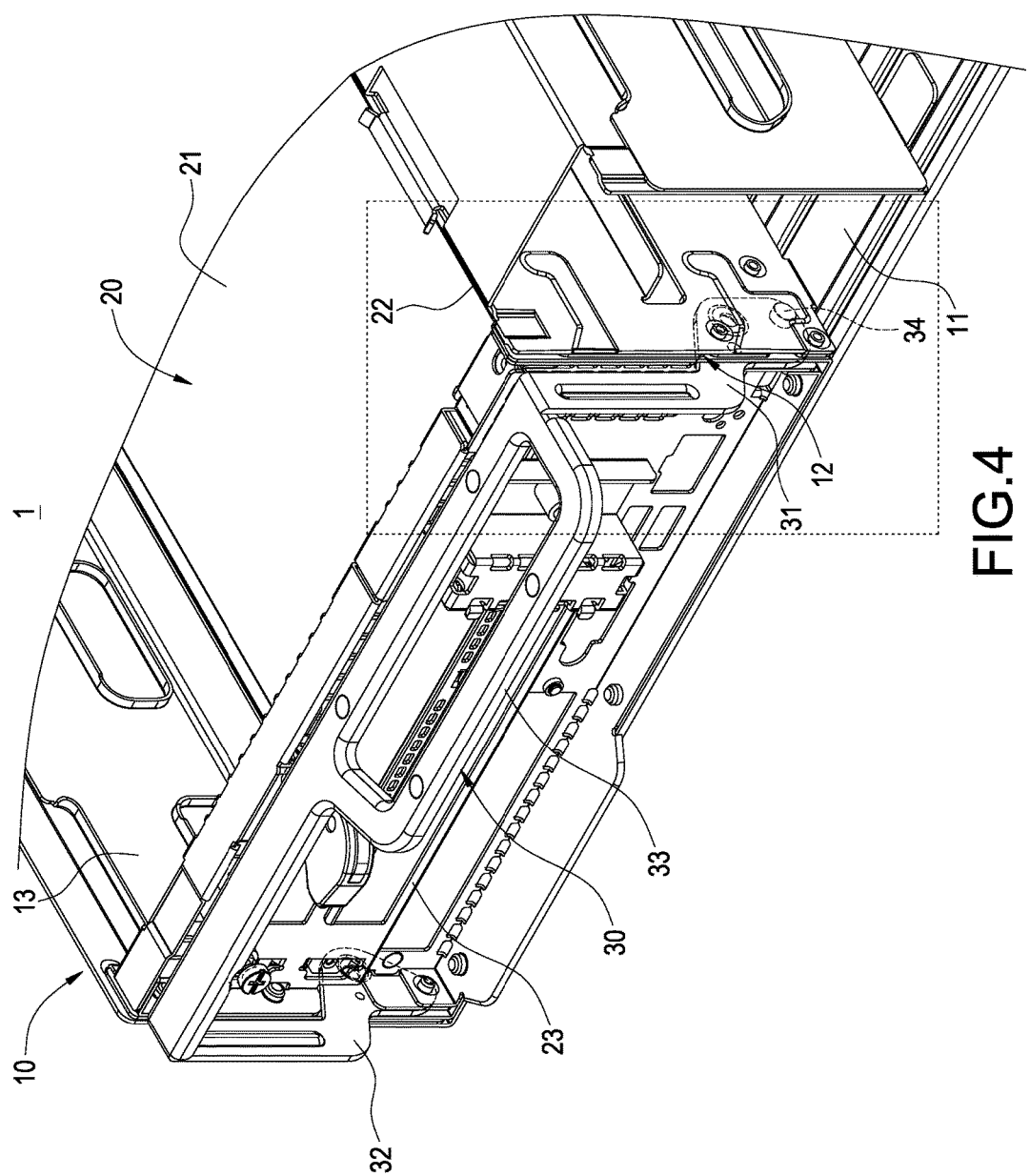
FIG. 4 is a perspective partial view illustrating the server having the removable storage structure.
Figure 5:
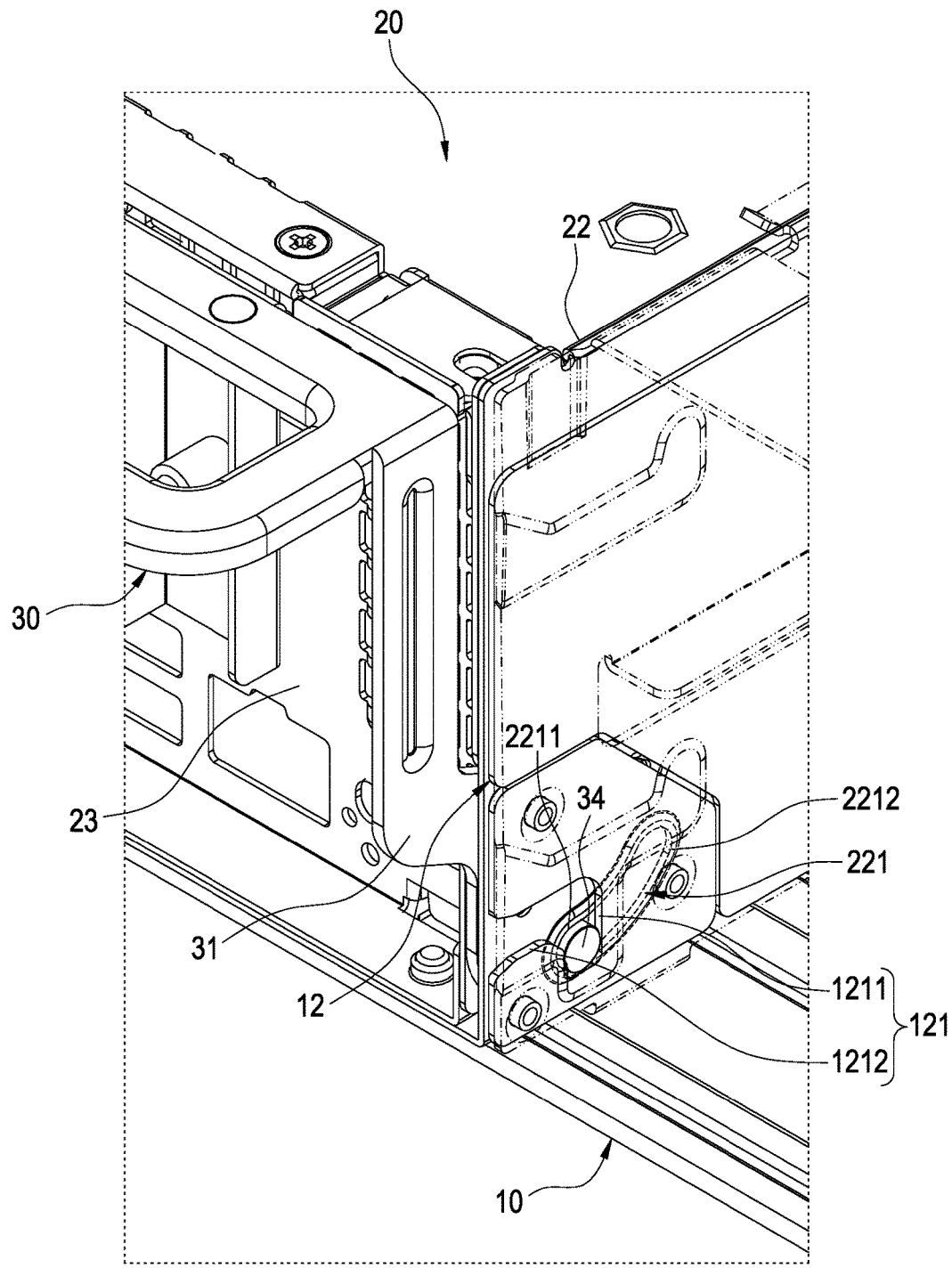
FIG. 5 is a schematic in-use view illustrating the server having the removable storage structure.

Please refer to FIGS. 4 and 5 for a perspective partial view and an in-use view illustrating the server having the removable storage structure. In the present embodiment, the sliding slot 221 is an arc-shaped slot, and the guiding slot 121 is an L-shaped slot.

In detail, the sliding slot 221 includes a first end 2211 close to the bottom plate 11 and a second end 2212 opposite to the first end 2211. The guiding slot 121 includes a vertical opening 1211 and a horizontal opening 1212 communicating with the vertical opening 1211. The vertical opening 1211 overlaps the first end 2211 of the sliding slot 221.

Figure 6:
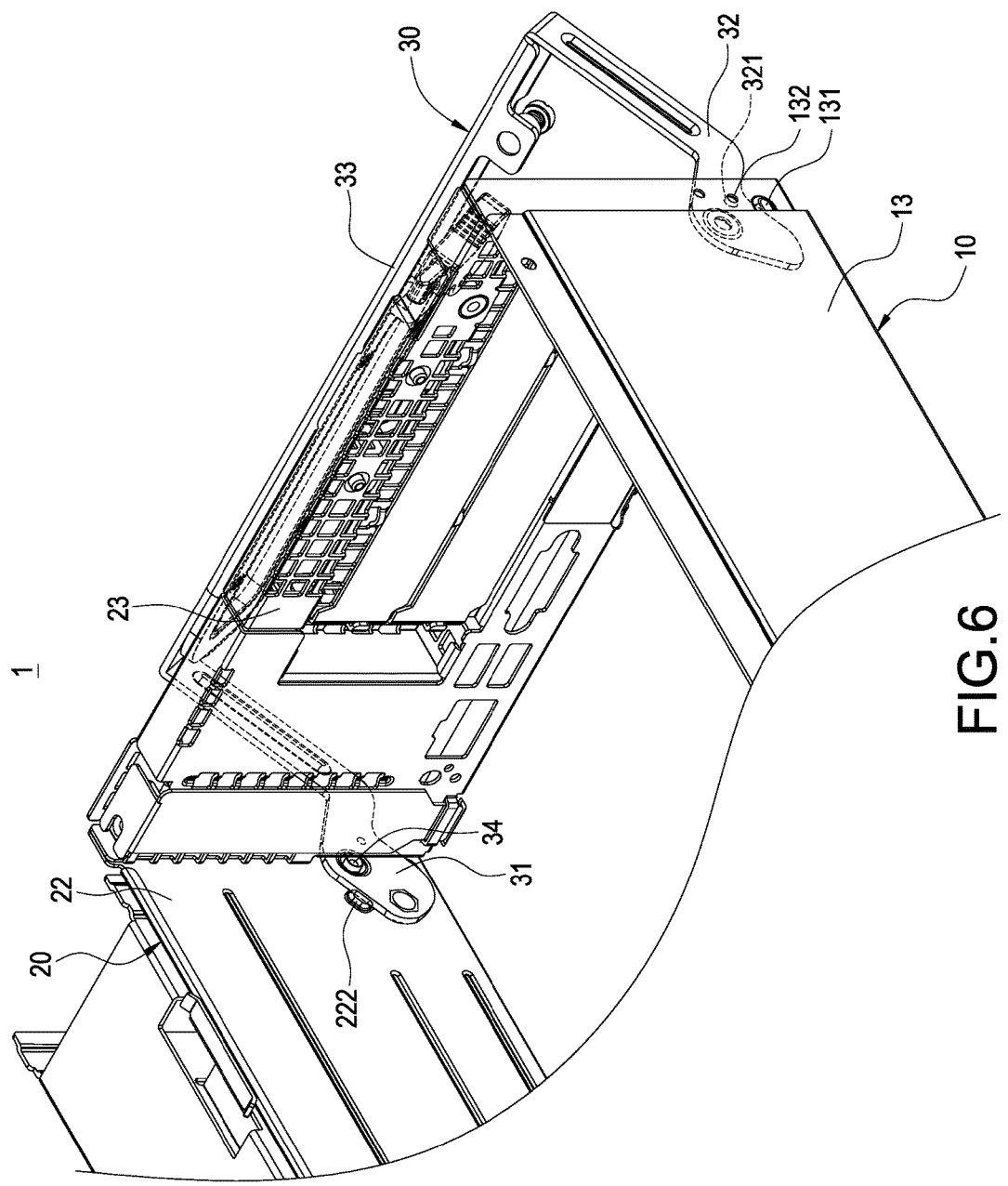
FIG. 6 is a schematic view showing that a handle structure is rotated.
Figure 7:
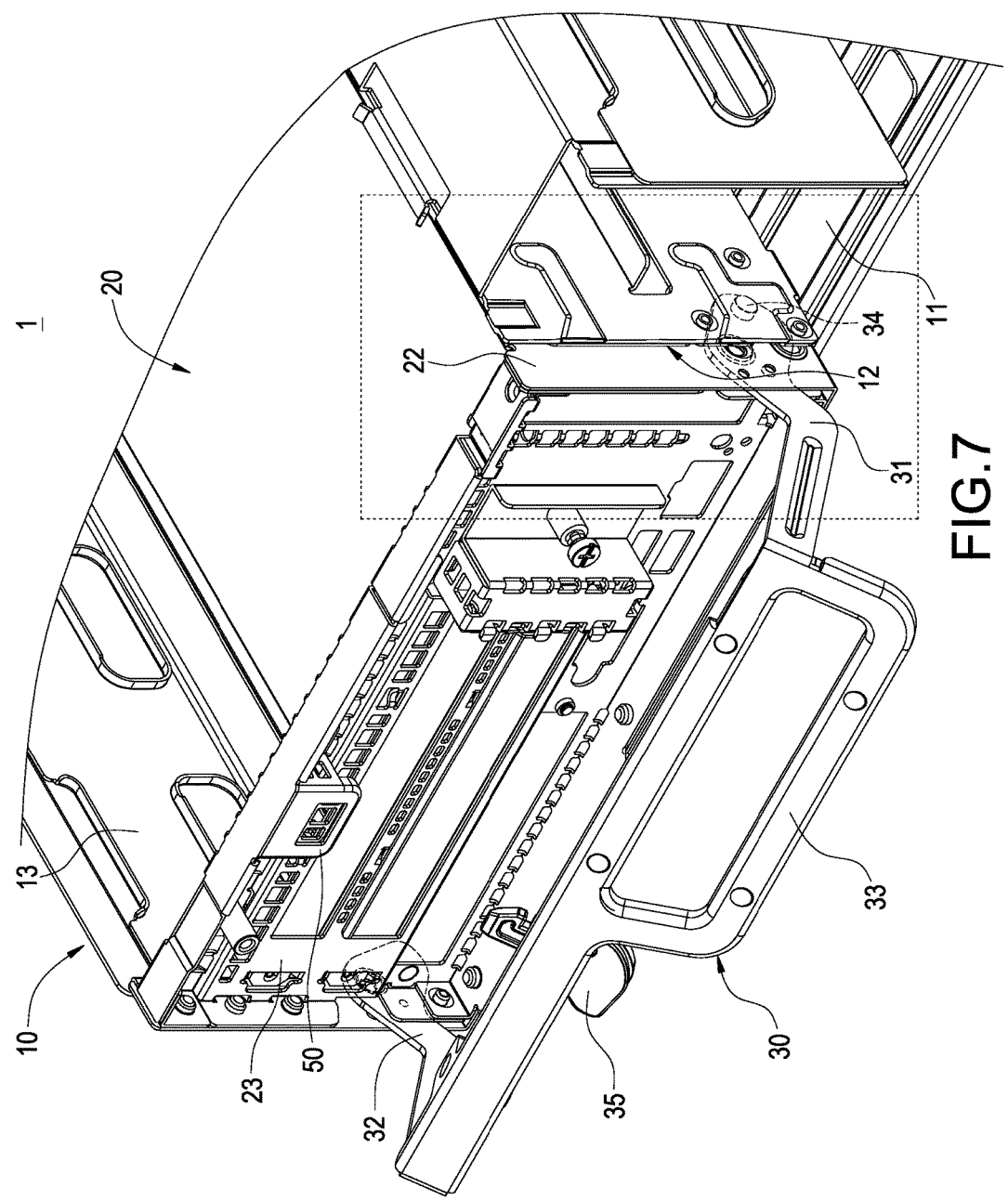
FIG. 7 is a schematic view taken from a different angle, showing the rotated handle structure.
Figure 8:
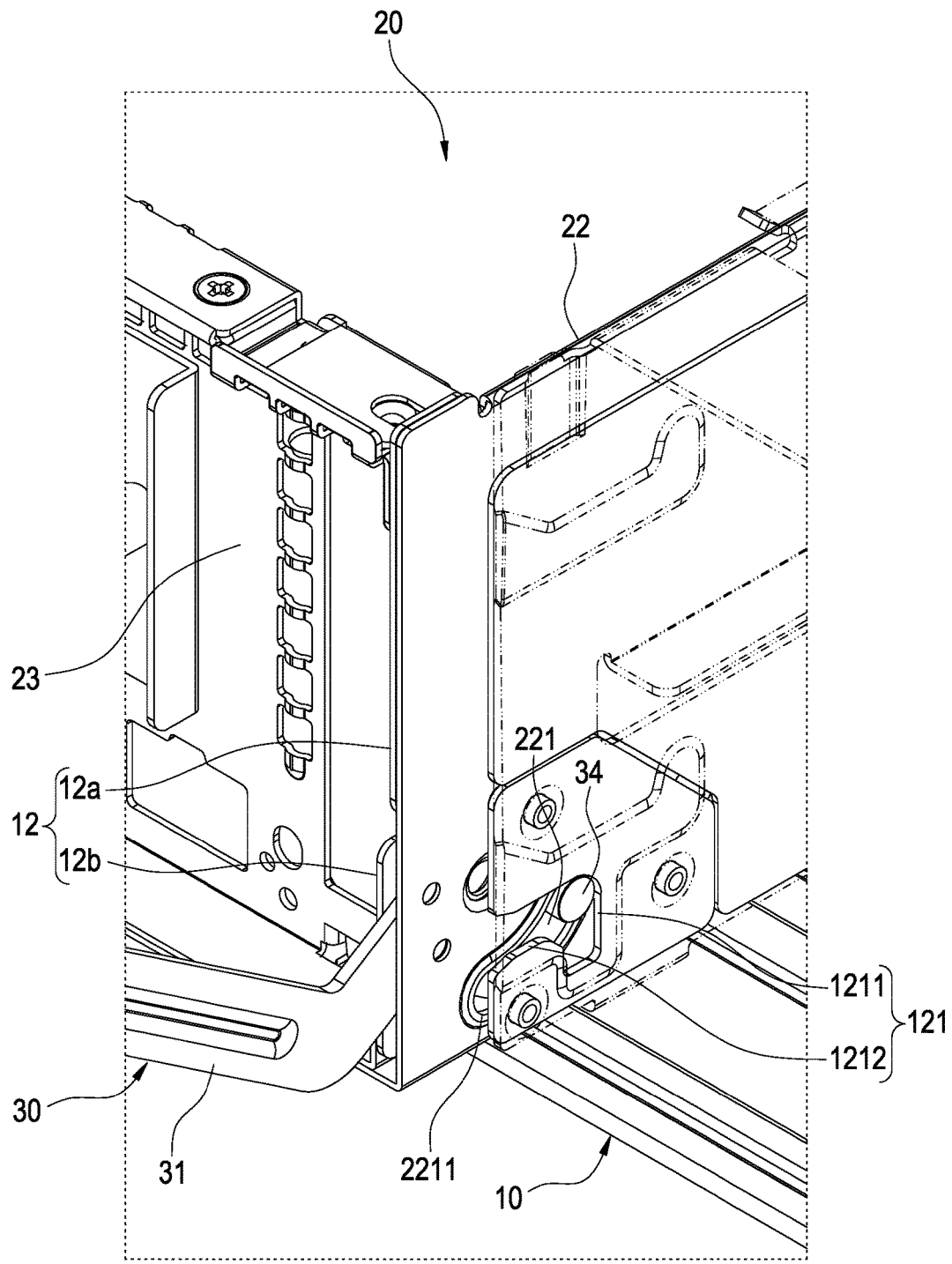
FIG. 8 is a partial enlarged view showing the handle structure.

Referring to FIGS. 6 to 8 for two schematic views taken from different angles and a partial enlarged view showing the handle structure 30. As shown in FIG. 6, when the handle structure 30 is rotated downwards, the handle 33 is rotated by means of the first arm 31 and the second arm 32 until the handle 33 is rotated to a predetermined angle with respect to the heat dissipating plate 23 to cause the first arm 31 and the second arm 32 to be blocked by the first blocker 222 and the second blocker 131 respectively. In this way, the handle structure 30 is limited by this predetermined angle and is thus prevented from over-rotation.

It should be noted that, in the present embodiment, the second plate 13 includes a first positioning portion 132, and the second arm 32 includes a second positioning portion 321 disposed corresponding to the first positioning portion 132. When the second arm 32 is rotated to a predetermined angle with respect to the second plate 13, the first positioning portion 132 is engaged with the second positioning portion 321, so that the handle structure 30 can be positioned at multiple positions. In this embodiment, the first plate 12 and the partition plate 22 also have structures for engagement with each other. The first positioning portion 132 is a hole, and the second positioning portion 321 is a protruding block; however, the present invention is not limited in this regard.

Referring to FIG. 7, when the handle structure 30 is rotated downwards, the slide pin 34 is moved in the sliding slot 221 and guided by the guiding slot 121 to thereby drive the partition plate 22 to move in a direction away from the bottom plate 11. It should be noted that, in the present embodiment, the server 1 further includes a fastening plate 50 coupled to the heat dissipating plate 23, the handle structure 30 further includes a hook 35 pivotally connected to the handle 33, the hook 35 is engaged with the fastening plate 50 to prevent the handle structure 30 from being detached from the heat dissipating plate 23. The hook 35 can be detached from the fastening plate 50 by exerting a force onto the hook 35.

To be more specific, in FIG. 8, the slide pin 34 is moved along the guiding slot 121 from a bottom portion of the vertical opening 1211 to a top portion of the vertical opening 1211. At this point, the handle structure 30 is limited by a particular angle. It should be noted that, in this embodiment, the first plate 12 includes a first board 12a and a guide plate 12b. The guide plate 12b is connected to the first board 12a and is disposed adjacent to the heat dissipating plate 23 at its one side. The guiding slot 121 is disposed on the guide plate 12b.

Figure 9:
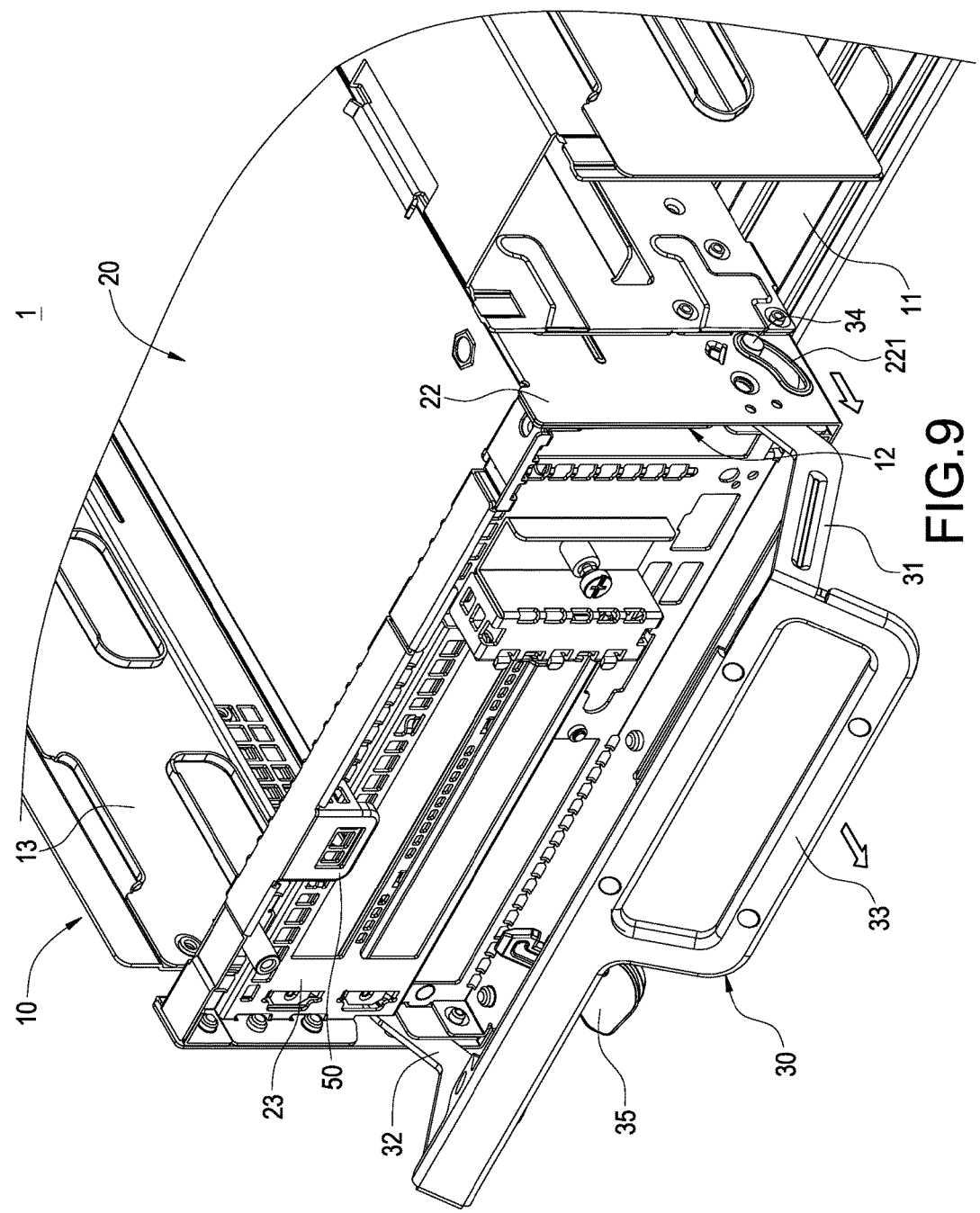
FIG. 9 is a schematic view showing that the storage case is to be removed from the server having the removable storage structure.

Please refer to FIG. 9 for a schematic view showing that the storage case is to be removed from the removable storage structure. When the handle structure 30 is rotated to the particular angle, the storage case 20 is partially moved out of the bottom plate 11 as the partition plate 22 is driven to be moved by the slide pin 34. Then, the user can exert a force to the handle 33 to take the storage case 20 out of the housing 10.

It is to be understood that the above descriptions are merely the preferable embodiment of the present invention and are not intended to limit the scope of the present invention. Equivalent changes and modifications made in the spirit of the present invention are regarded as falling within the scope of the present invention.

What is claimed is:

1. A server having a removable storage structure, comprising:
   a housing, the housing including a bottom plate and including a first plate and a second plate spaced apart from each other on the bottom plate, the first plate including a guiding slot;
   a storage case disposed on the bottom plate, the storage case being disposed between the first plate and the second plate, the storage case including a support plate on which a motherboard is disposed and including a partition plate and a heat dissipating plate disposed around the support plate, the partition plate being in contact with the first plate, the partition plate including a sliding slot disposed corresponding to the guiding slot, the heat dissipating plate being disposed between the second plate and the partition plate; and
   a handle structure, the handle structure including a first arm, a second arm, a handle connected to the first arm and the second arm, and a slide pin, the first arm being pivotally connected to the partition plate and including a through hole, the second arm being pivotally connected to the second plate, the slide pin being inserted in the sliding slot and the guiding slot via the through hole, wherein when the handle being rotated with respect to the heat dissipating plate by using the first arm and the second arm, the slide pin is moved in the sliding slot and guided by the guiding slot, thereby driving the partition plate to move in a direction away from the bottom plate.

2. The server having the removable storage structure according to claim 1, wherein the first plate includes a first board and a guide plate, the guide plate is connected to the first board and is arranged adjacent to the heat dissipating plate at its one side, and the guiding slot is disposed on the guiding slot.

3. The server having the removable storage structure according to claim 1, wherein the second plate includes a first positioning portion, and the second arm includes a second positioning portion disposed corresponding to the first positioning portion, wherein when the second arm is rotated to a predetermined angle with respect to the second plate, the first positioning portion is engaged with the second positioning portion.

4. The server having the removable storage structure according to claim 1, wherein a first blocker is disposed on the partition plate and is arranged adjacent to the sliding slot, and when the first arm is rotated to a predetermined angle with respect to the partition plate, the first arm is blocked by the first blocker and stops rotating.

5. The server having the removable storage structure according to claim 1, wherein a second blocker is disposed on the second plate, and when the second arm is rotated to a predetermined angle with respect to the second plate, the second arm is blocked by the second blocker and stops rotating.

6. The server having the removable storage structure according to claim 1, wherein the sliding slot is an arc-shaped slot, and the guiding slot is an L-shaped slot.

7. The server having the removable storage structure according to claim 1, wherein the sliding slot includes a first end close to the bottom plate and a second end opposite to the first end, the guiding slot includes a vertical opening and a horizontal opening communicating with the vertical opening, and the vertical opening overlaps the first end of the sliding slot.

8. The server having the removable storage structure according to claim 1, wherein the first arm, the second arm and the handle are integrally formed of a single metal plate by pressing and bending processes.

9. The server having the removable storage structure according to claim 1, wherein a fastening plate is coupled to the heat dissipating plate, the handle structure further includes a hook pivotally connected to the handle, the hook is engaged with the fastening plate to prevent the handle structure from being detached from the heat dissipating plate, and the handle structure is detached from the fastening plate by exerting a force onto the hook.

10. The server having the removable storage structure according to claim 1, further comprising a fastening element, the handle structure is screw connected to the heat dissipating plate by using the fastening element.

* * * * *